US 10,553,422 B2

(12) United States Patent
Kikumoto et al.

(10) Patent No.: US 10,553,422 B2
(45) Date of Patent: Feb. 4, 2020

(54) SUBSTRATE TREATMENT METHOD OF TREATING SUBSTRATE, AND SUBSTRATE TREATMENT APPARATUS

(71) Applicant: SCREEN Holdings Co., Ltd., Kyoto (JP)

(72) Inventors: Noriyuki Kikumoto, Kyoto (JP); Shuichi Yasuda, Kyoto (JP); Kazuhiro Fujita, Kyoto (JP); Michinori Iwao, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 169 days.

(21) Appl. No.: 15/696,927

(22) Filed: Sep. 6, 2017

(65) Prior Publication Data

US 2018/0090308 A1 Mar. 29, 2018

(30) Foreign Application Priority Data

Sep. 26, 2016 (JP) .................................. 2016-186817

(51) Int. Cl.
*H01L 21/02* (2006.01)
*B08B 3/08* (2006.01)
(Continued)

(52) U.S. Cl.
CPC .......... *H01L 21/02052* (2013.01); *B08B 3/08* (2013.01); *B08B 3/10* (2013.01); *H01L 21/67051* (2013.01); *H01L 21/68764* (2013.01)

(58) Field of Classification Search
None
See application file for complete search history.

(56) References Cited

U.S. PATENT DOCUMENTS

| 6,444,029 B1 | 9/2002 | Kimura et al. ................. 118/52 |
| 2006/0219264 A1 | 10/2006 | Miya .............................. 134/21 |

(Continued)

FOREIGN PATENT DOCUMENTS

| CN | 1505099 A | 6/2004 |
| CN | 103165496 A | 6/2013 |

(Continued)

OTHER PUBLICATIONS

EPO machine translation of JP 2004237257 A retrieved on Jun. 8, 2019 (Year: 2019).*

(Continued)

*Primary Examiner* — Eric W Golightly
(74) *Attorney, Agent, or Firm* — Ostrolenk Faber LLP

(57) ABSTRACT

A substrate treatment apparatus includes a substrate retainer that horizontally retains the substrate. A blocking portion has a lower surface facing an upper surface of said substrate and a tapered surface extending diagonally upward from an inner periphery of the lower surface toward a center of the lower surface. A rotary portion rotates the substrate and the blocking portion about a vertical rotary axis. A first supply unit supplies treatment liquid and a second supply unit supplies rinse liquid toward a tapered surface from the center of the rotated blocking portion through said opening of said blocking portion. The first supply unit supplies the treatment liquid during a first period and the second supply unit supplies the rinse liquid during a second overlapping period.

4 Claims, 9 Drawing Sheets

(51) Int. Cl.
*B08B 3/10* (2006.01)
*H01L 21/67* (2006.01)
*H01L 21/687* (2006.01)

(56) References Cited

U.S. PATENT DOCUMENTS

2013/0104940 A1 5/2013 Nagamine et al.
2013/0152976 A1 6/2013 Amano .......................... 134/26

FOREIGN PATENT DOCUMENTS

| | | |
|---|---|---|
| JP | 2708340 | 2/1998 |
| JP | 2000-12443 A | 1/2000 |
| JP | 2003-045838 | 2/2003 |
| JP | 2004-237257 A | 8/2004 |
| JP | 2013-098178 A | 5/2013 |
| JP | 2015-192049 A | 11/2015 |
| TW | 201624558 A | 7/2016 |

OTHER PUBLICATIONS

Taiwan Office Action and search report (Application No. 106130821) dated Jun. 26, 2018 and English translation of Search Report.
Office Action dated Sep. 17, 2018 in counterpart Korean Patent Application No. 10-2017-0116431 with Japanese translation and English partial translation based on the Japanese translation.

\* cited by examiner

F I G . 3
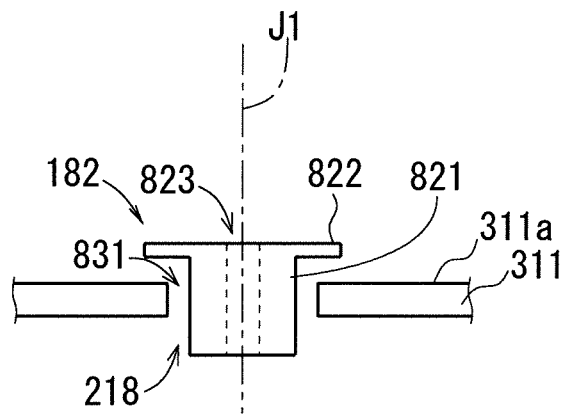
F I G . 4
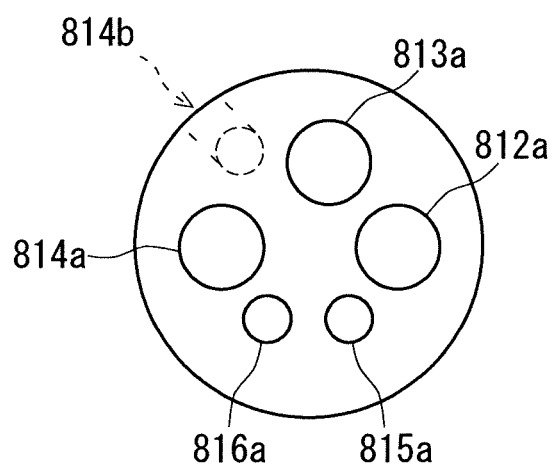

F I G . 8
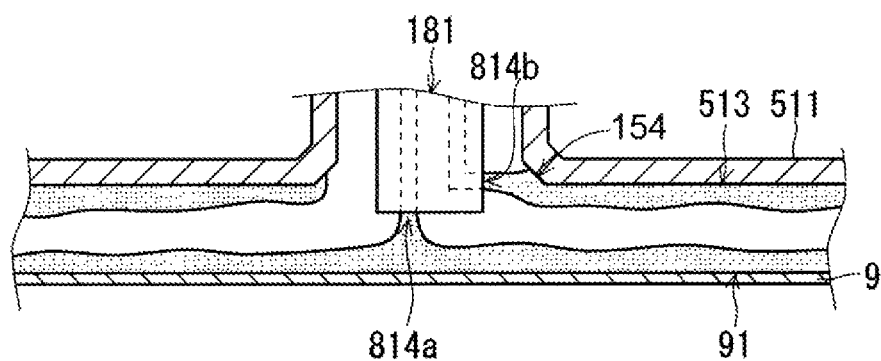

FIG. 9

| | FLOW RATE OF PURE WATER [mL/min] | ROTATIONAL SPEED [rpm] | DISCHARGE PERIOD [sec] | TS-N2 [mL/min] | BB-N2 [mL/min] | BS-N2 [mL/min] | RESULT |
|---|---|---|---|---|---|---|---|
| FIRST CONDITION | 500 | 1200 | 4 | 50 | 5 | 100 | OK |
| SECOND CONDITION | | | 3 | | | | OK |
| THIRD CONDITION | | | 2 | | | | OK |
| FOURTH CONDITION | | | 1 | | | | NG |
| FIFTH CONDITION | 400 | 1200 | 4 | 50 | 5 | 100 | OK |
| SIXTH CONDITION | | | 3 | | | | OK |
| SEVENTH CONDITION | | | 2 | | | | OK |
| EIGHTH CONDITION | | | 1 | | | | NG |
| NINTH CONDITION | 300 | 1200 | 4 | 50 | 5 | 100 | OK |
| TENTH CONDITION | | | 3 | | | | OK |
| ELEVENTH CONDITION | | | 2 | | | | NG |
| TWELFTH CONDITION | | | 1 | | | | NG |

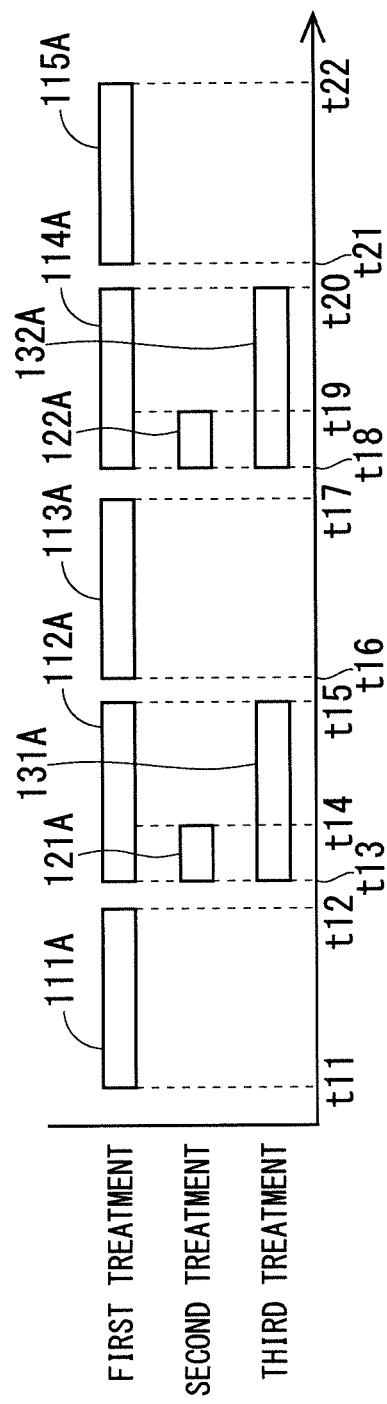

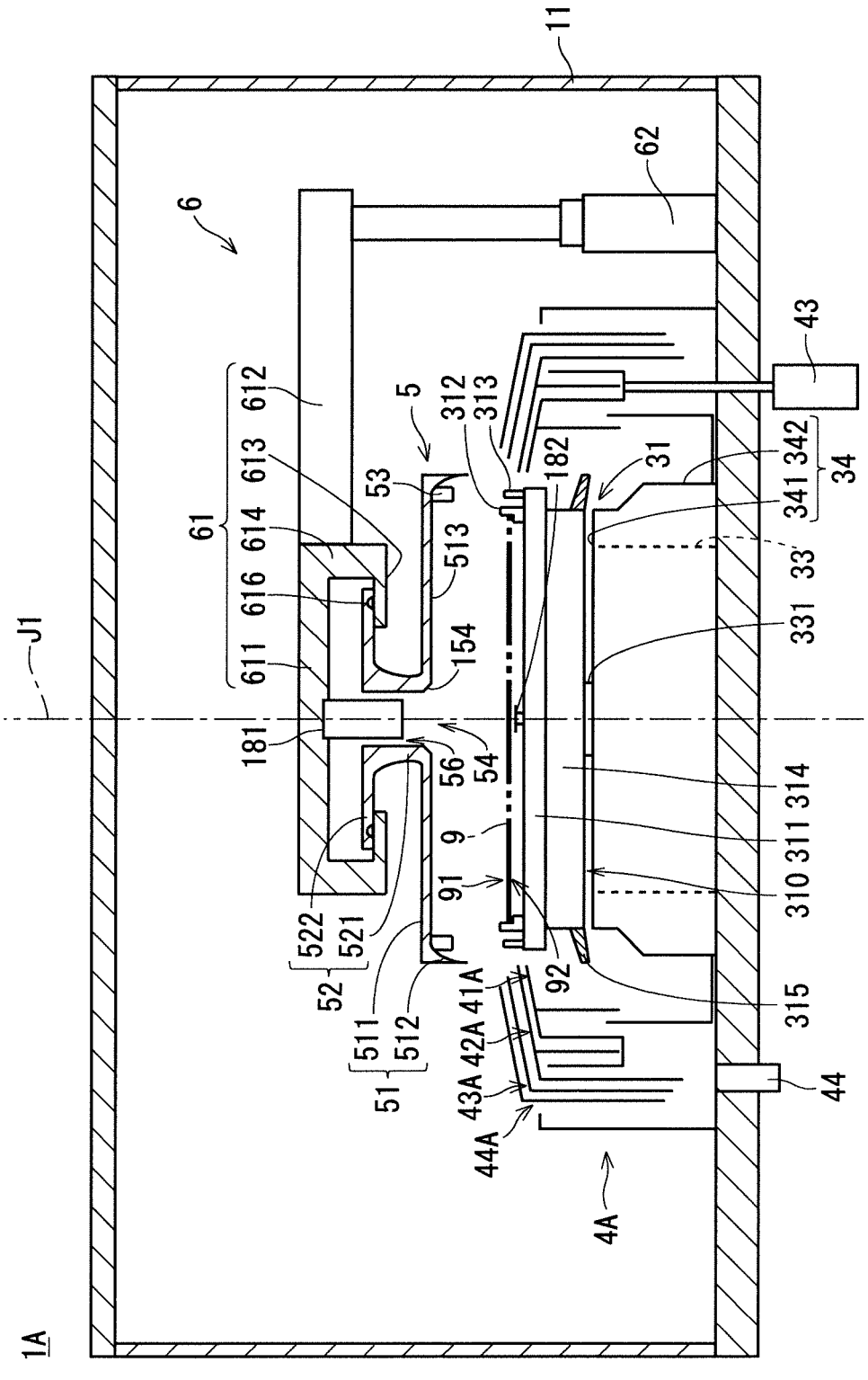

SUBSTRATE TREATMENT METHOD OF TREATING SUBSTRATE, AND SUBSTRATE TREATMENT APPARATUS

BACKGROUND OF THE INVENTION

Field of the Invention

The present invention relates to a technique of treating a substrate and a blocking portion positioned above the substrate.

Description of the Background Art

There has conventionally been known a technique of treating a substrate by supplying treatment liquid into a space between an upper surface of the substrate and a lower surface of a blocking portion positioned above the substrate while rotating the substrate and the blocking portion.

An apparatus configured to conduct such treatment may cause part of the treatment liquid fed onto the upper surface of the substrate to scatter and adhere to the lower surface of the blocking portion. The treatment liquid kept adhering to the lower surface of the blocking portion may form particles and contaminate the substrate. The lower surface of the blocking portion is thus rinsed at appropriate timing.

Japanese Patent No. 2708340 describes an apparatus configured to discharge rinse liquid from a rinse nozzle provided near a rotary axis of a blocking portion toward a lower surface of the blocking portion to rinse the lower surface of the blocking portion. Japanese Patent Application Laid-Open No. 2003-45838 describes an apparatus configured to discharge rinse liquid from a rinse nozzle provided on a side of a blocking portion toward a lower surface of the blocking portion to rinse the lower surface of the blocking portion.

These apparatuses, however, fail to supply the substrate with treatment liquid while the blocking portion is rinsed, and modification will lead to improvement in throughput.

SUMMARY OF THE INVENTION

The present invention is directed to a substrate treatment method of treating a substrate, and a substrate treatment apparatus.

A substrate treatment method of treating a substrate according to an aspect of the present invention includes: a rotating step of rotating the substrate and a blocking portion having a lower surface facing an upper surface of the substrate about a rotary axis perpendicular to the upper surface; a first supplying step including at least one first treatment process of supplying treatment liquid toward the upper surface of the rotated substrate; and a second supplying step including at least one second treatment process of supplying rinse liquid toward the lower surface of the rotated blocking portion; in which the first supplying step is executed during a first period and the second supplying step is executed during a second period, and the first period and the second period are overlapped with each other during an overlapped period.

This substrate treatment method achieves improvement in throughput.

Preferably, the at least one first treatment process includes at least one rinsing treatment process of supplying rinse liquid toward the upper surface of the rotated substrate, and the overlapped period corresponds to a period while an execution period of the rinsing treatment process and the second period are over lapped with each other.

Preferably, the at least one rinsing treatment process in the at least one first treatment process includes a plurality of rinsing treatment processes, and the overlapped period corresponds to a period while an execution period of at least a last one of the plurality of rinsing treatment processes and the second period are over lapped with each other.

Preferably, in the first treatment and the second treatment overlapped with each other in a temporal manner, the second treatment ends while the first treatment is being executed.

Preferably, in the first treatment and the second treatment overlapped with each other in a temporal manner, the first treatment starts before the second treatment starts.

Preferably, the second treatment is executed while the upper surface of the substrate is coated with the treatment liquid by the first treatment started earlier.

Preferably, in the first treatment and the second treatment overlapped with each other in a temporal manner, the first treatment and the second treatment start simultaneously.

Preferably, the rotating step includes, as treatment executed after the first supplying step and the second supplying step, treatment of rotating the substrate and the blocking portion faster than rotation in the first supplying step and the second supplying step.

Preferably, the substrate treatment method further includes: a gas supplying step of supplying inert gas into a space between the upper surface of the substrate and the lower surface of the blocking portion.

Preferably, the gas supplying step includes supplying the inert gas into the space at least after the second period and while the upper surface of the substrate is coated with the treatment liquid.

A substrate treatment apparatus according to an aspect of the present invention is configured to treat a substrate and includes: a substrate retainer horizontally retaining the substrate; a blocking portion including a lower surface facing an upper surface of the substrate; a rotary portion configured to rotate the substrate and the blocking portion about a rotary axis passing a center of the substrate and extending vertically; a first supply unit configured to supply treatment liquid toward the upper surface of the rotated substrate through an opening provided at a center of the blocking portion in a planar view; and a second supply unit configured to supply rinse liquid toward the lower surface of the rotated blocking portion through the opening of the blocking portion; in which the first supply unit supplies the treatment liquid during a first period and the second supply unit supplies the rinse liquid during a second period, and the first period and the second period are overlapped with each other during an overlapped period.

This substrate treatment apparatus achieves improvement in throughput.

Preferably, the second supply unit includes a discharge port disposed below the opening and opened horizontally, and supplies rinse liquid from the discharge port toward the lower surface of the rotated blocking portion.

Preferably, the blocking portion further includes a tapered surface extending diagonally upward from an inner periphery toward a center of the lower surface, and the discharge port of the second supply unit faces the tapered surface.

Preferably, the blocking portion further includes a closing portion closing a lateral portion of a space between the upper surface of the substrate and the lower surface of the blocking portion.

Preferably, the substrate treatment apparatus further includes: a gas supply unit configured to supply inert gas to a space between the upper surface of the substrate and the lower surface of the blocking portion through the opening of the blocking portion.

It is thus an object of the present invention to provide a technique achieving improvement in throughput.

These and other objects, features, aspects and advantages of the present invention will become more apparent from the following detailed description of the present invention when taken in conjunction with the accompanying drawings.

BRIEF DESCRIPTION OF THE DRAWING

FIG. 3 is an enlarged sectional view of a lower nozzle 182 and the vicinity thereof;

FIG. 4 is a bottom view from below, of an upper nozzle 181;

FIG. 8 is a sectional view depicting first treatment 112 and second treatment 121 in a period from time t3 to time t4;

FIG. 9 is a chart of relations between treatment conditions and treatment results of the second treatment;

FIG. 10 is a timing chart of liquid treatment (step S3) according to a modification example; and FIG. 11 is a sectional view of a substrate treatment apparatus 1A according to the modification example.

DESCRIPTION OF THE PREFERRED EMBODIMENTS

Figure 1:
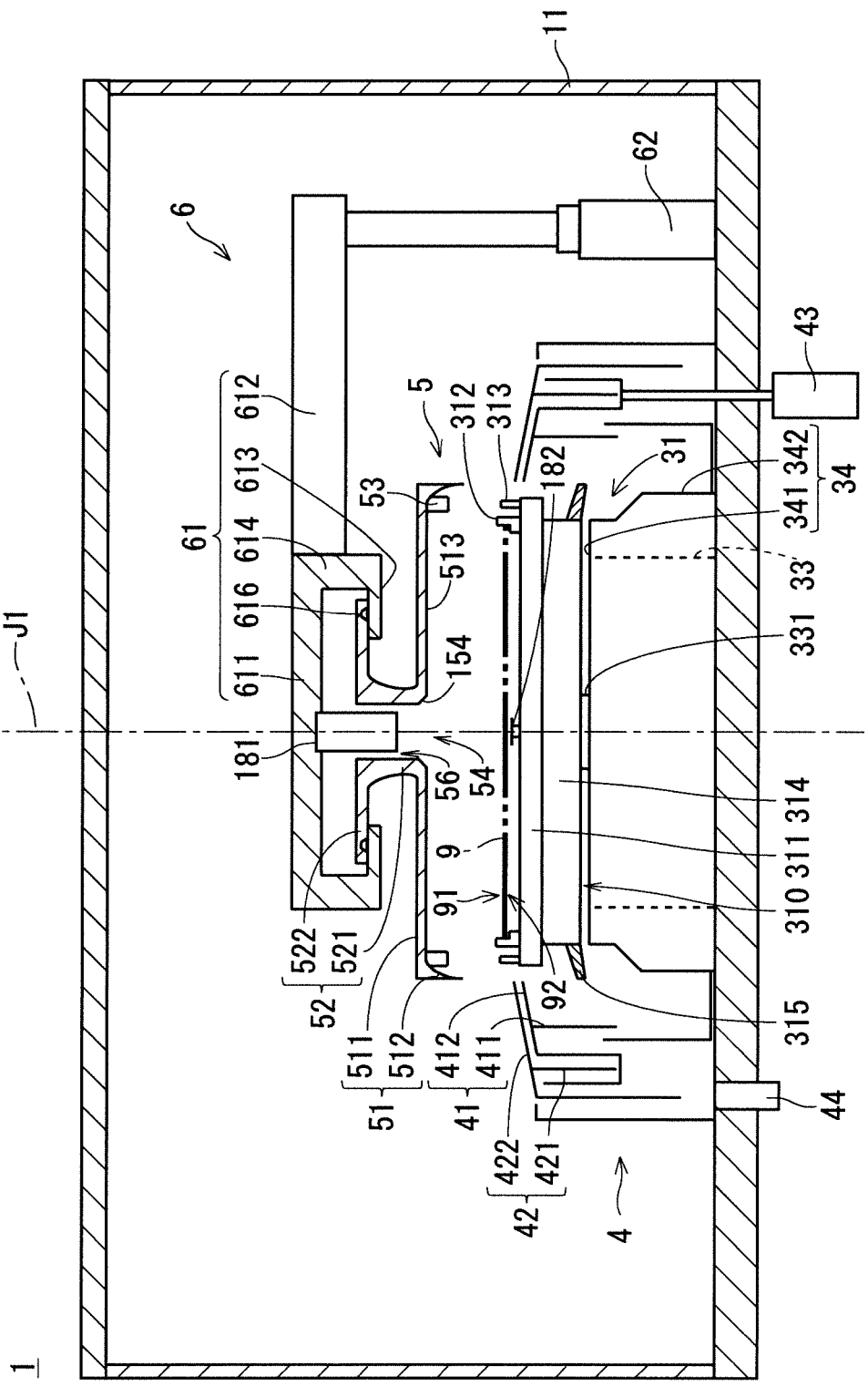
FIGS. 1 and 2 are sectional views of a substrate treatment apparatus 1.

Preferred embodiments will now be described below with reference to the drawings. Portions having similar configurations and functions will be denoted by identical reference signs in the drawings, and will not be described repeatedly. These drawings are prepared in a schematic manner. Some of the drawings are provided with, where appropriate, XYZ orthogonal coordinate axes including a vertical Z axis and a horizontal XY plane for clarification of directional relation. In the following description, simple expression of up and down will indicate a +direction and a −direction on the Z axis, respectively.

<1. Preferred Embodiments>

<1.1 Configuration of Substrate Treatment Apparatus 1>

Figure 2:
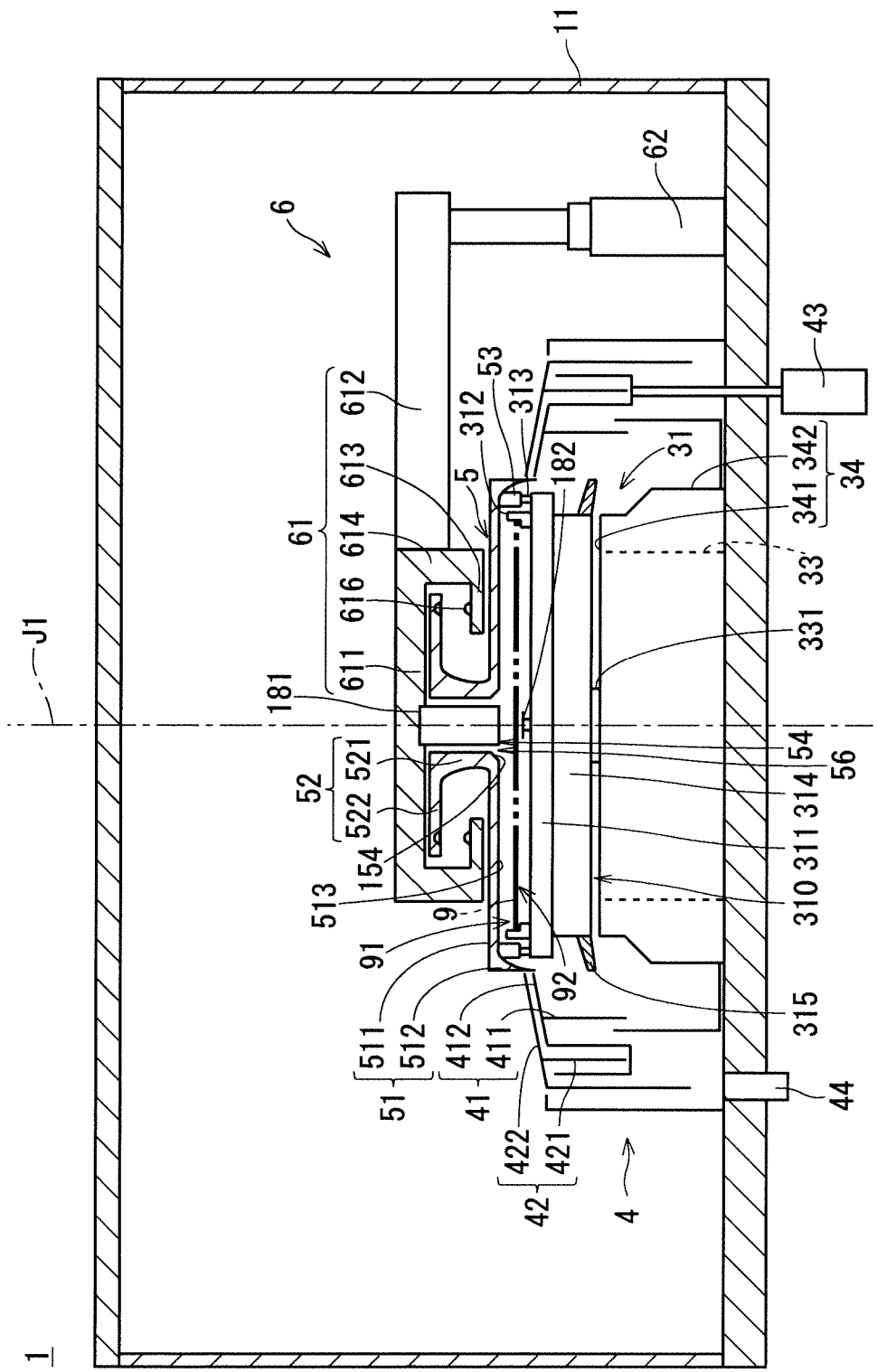

FIGS. 1 and 2 are sectional views each depicting a configuration of a substrate treatment apparatus 1 according to a first preferred embodiment of the present invention. The substrate treatment apparatus 1 is a single wafer processing apparatus configured to treat semiconductor substrates 9 (hereinafter, simply referred to as "substrates 9") one by one. The substrate treatment apparatus 1 includes a substrate retainer 31, a substrate rotary mechanism 33, a cup portion 4, a top plate 5, an opposed member shift mechanism 6, and an upper nozzle 181, which are accommodated in a housing 11. FIG. 1 depicts the substrate treatment apparatus 1 in a state where the opposed member shift mechanism 6 shifts the top plate 5 upward, whereas FIG. 2 depicts the substrate treatment apparatus 1 in another state where the opposed member shift mechanism 6 shifts the top plate 5 downward.

The substrate retainer 31 horizontally retains the substrate 9. The substrate retainer 31 includes a retentive base 311, a plurality of chucks 312, a plurality of engagement portions 313, a base support 314, a lower projection 315, and a lower nozzle 182. The substrate 9 is disposed above the retentive base 311. Each of the retentive base 311 and the base support 314 is a substantially disc member having a vertical center axis J1. The retentive base 311 is disposed above the base support 314 and is supported by the base support 314 located therebelow. The retentive base 311 is larger in outer diameter than the base support 314. The retentive base 311 has a circumferential end around the center axis J1 entirely expanding radially outward from the base support 314. The retentive base 311 can be made of fluororesin having relatively high chemical resistance. The base support 314 can be made of vinyl chloride having relatively light weight and high mechanical strength.

The lower nozzle 182 has a substantially tubular shape and is attached to a center portion of the retentive base 311.

FIG. 3 is an enlarged sectional view of the lower nozzle 182 and the vicinity thereof. The lower nozzle 182 includes a nozzle body 821 having a substantially tubular shape around the center axis J1, and a hood 822 having a substantially annular disc shape expanding radially outward from an upper end of the nozzle body 821. The nozzle body 821 is inserted to a through hole having a substantially columnar shape and provided in a center portion of the retentive base 311. There is provided, between a side surface of the nozzle body 821 and an inner circumferential surface of the through hole, a lower ring flow channel 218 allowing inert gas to pass therethrough.

The nozzle body 821 is provided, in a center portion of an upper end surface thereof, with a lower surface center discharge port 823. The lower surface center discharge port 823 is provided on the center axis J1 in the center portion of the retentive base 311. The hood 822 is spaced apart from and disposed above an upper surface 311a of the retentive base 311, and expands radially outward along the upper surface 311a. The hood 822 has a lower surface substantially in parallel with the upper surface 311a.

With reference to FIG. 1 again, the lower projection 315 is a substantially ring member around the center axis J1, and expands radially outward from a side surface of the base support 314. The lower projection 315 is provided below and spaced apart from the retentive base 311. The lower projection 315 has an outer diameter larger than that of the retentive base 311 and not larger than that of the top plate 5. FIG. 1 exemplifies the lower projection 315 expanding radially outward from a lower end of the base support 314. The lower projection 315 has an upper surface and a lower surface each slanting downward toward a radially outer end thereof.

The plurality of chucks 312 is disposed circumferentially along an outer circumference of the upper surface of the retentive base 311 at substantially equal angular intervals around the center axis J1. The plurality of chucks 312 of the substrate retainer 31 supports an outer edge of the substrate 9. The base support 314 is provided therein with a drive structure for each of the chucks 312. The plurality of engagement portions 313 is disposed circumferentially along the outer circumference of the upper surface of the retentive base 311 at substantially equal angular intervals around the center axis J1. The plurality of engagement portions 313 is disposed radially outside the plurality of chucks 312.

The substrate rotary mechanism 33 is accommodated in a rotary mechanism accommodator 34. The substrate rotary mechanism 33 and the rotary mechanism accommodator 34 are disposed below the substrate retainer 31. The substrate rotary mechanism 33 rotates the substrate 9 along with the substrate retainer 31 around the center axis J1.

The rotary mechanism accommodator 34 includes an upper surface 341 having a substantially annular disc shape and covering the top of the substrate rotary mechanism 33, and a side surface 342 having a substantially tubular shape and covering a lateral portion of the substrate rotary mechanism 33. The upper surface 341 of the rotary mechanism accommodator 34 is provided, in a center portion, with an opening receiving a rotary shaft 331 of the substrate rotary mechanism 33. The rotary shaft 331 is connected to a lower surface of the base support 314. The upper surface 341 of the rotary mechanism accommodator 34 is radially spaced apart and expands radially outward from the rotary shaft 331. The upper surface 341 of the rotary mechanism accommodator 34 vertically faces the lower surface of the base support 314 with a gap therebetween. The gap or a space between the upper surface 341 of the rotary mechanism accommodator 34 and the lower surface of the base support 314 will hereinafter be referred to as a "gap below retainer 310".

The cup portion 4 is a ring member around the center axis J1, and is disposed radially outside the substrate 9 and the substrate retainer 31. The cup portion 4 is disposed along the entire circumferences of the substrate 9 and the substrate retainer 31, and receives treatment liquid and the like scattering from the substrate 9 to the vicinity thereof. The cup portion 4 includes a first guard 41, a second guard 42, a guard shift mechanism 43, and an outlet port 44.

The first guard 41 includes a first guard side wall 411 and a first guard canopy 412. The first guard side wall 411 has a substantially tubular shape around the center axis J1. The first guard canopy 412 has a substantially annular disc shape around the center axis J1, and expands radially inward from an upper end of the first guard side wall 411. The second guard 42 includes a second guard side wall 421 and a second guard canopy 422. The second guard side wall 421 has a substantially tubular shape around the center axis J1, and is positioned radially outside the first guard side wall 411. The second guard canopy 422 has a substantially annular disc shape around the center axis J1, is disposed above the first guard canopy 412, and expands radially inward from an upper end of the second guard side wall 421.

Each of the first guard canopy 412 and the second guard canopy 422 has an inner diameter slightly larger than the outer diameter of the retentive base 311 of the substrate retainer 31 and the outer diameter of the top plate 5. The first guard canopy 412 has an upper surface and a lower surface each slanting downward toward a radially outer end thereof. The second guard canopy 422 similarly has an upper surface and a lower surface each slanting downward toward a radially outer end thereof.

The guard shift mechanism 43 vertically shifts the first guard 41 and the second guard 42 to switch between the first guard 41 and the second guard 42 as a guard receiving treatment liquid and the like from the substrate 9. Treatment liquid and the like received by the first guard 41 and the second guard 42 of the cup portion 4 are drained out of the housing 11 through the outlet port 44. Gas in the first guard 41 and the second guard 42 is also exhausted out of the housing 11 through the outlet port 44.

The top plate 5 is a substantially circular member in a planar view. The top plate 5 is an opposed member facing an upper surface 91 of the substrate 9 and is a shield plate shielding the top of the substrate 9. The outer diameter of the top plate 5 is larger than that of the substrate 9 as well as that of the retentive base 311. The top plate 5 includes an opposed member body 51, a retained portion 52, and a plurality of engagement portions 53. The opposed member body 51 includes an opposed member canopy 511, and an opposed member side wall 512. The opposed member canopy 511 is a substantially annular disc shape around the center axis J1, and has a lower surface 513 facing the upper surface 91 of the substrate 9. The opposed member canopy 511 is provided, in a center portion thereof, with an opposed member opening 54. The opposed member opening 54 can have a substantially circular shape in a planar view. The opposed member opening 54 has a diameter sufficiently smaller than a diameter of the substrate 9. The opposed member canopy 511 further has a tapered surface 154 extending diagonally upward from an inner circumference of the lower surface 513 toward the center opening 54. The opposed member side wall 512 is a substantially tubular member around the center axis J1, and expands downward from an outer circumference of the opposed member canopy 511. FIG. 2 depicts a state where the top plate 5 is rotated integrally with the substrate 9 about the center axis J1 to cause a space between the lower surface 513 of the top plate 5 and the upper surface 91 of the substrate 9 to be blocked from a remaining space in a chamber. The top plate 5 thus serves as a blocking portion in this state.

The plurality of engagement portions 53 is disposed circumferentially along an outer circumference of the lower surface 513 of the opposed member canopy 511 around the center axis J1 at substantially equal angular intervals. The plurality of engagement portions 53 is disposed radially inside the opposed member side wall 512.

The retained portion 52 is connected to an upper surface of the opposed member body 51. The retained portion 52 includes an opposed member tubular portion 521 and an opposed member flange portion 522. The opposed member tubular portion 521 is a substantially tubular portion projecting upward from a circumference of the opposed member opening 54 of the opposed member body 51. The opposed member tubular portion 521 can have a substantially tubular shape around the center axis J1. The opposed member flange portion 522 expands annularly and radially outward from an upper end of the opposed member tubular portion 521. The opposed member flange portion 522 can have a substantially annular disc shape around the center axis J1.

The opposed member shift mechanism 6 includes an opposed member retainer 61 and an opposed member lift mechanism 62. The opposed member retainer 61 retains the retained portion 52 of the top plate 5. The opposed member retainer 61 includes a retainer body 611, a body support 612, a flange support 613, and a support connector 614. The retainer body 611 can have a substantially disc shape around the center axis J1. The retainer body 611 covers the top of the opposed member flange portion 522 of the top plate 5. The body support 612 is a bar-shaped arm extending substantially horizontally. The body support 612 has a first end connected to the retainer body 611 and a second end connected to the opposed member lift mechanism 62.

The upper nozzle 181 projects downward from a center portion of the retainer body 611. The upper nozzle 181 is inserted to the opposed member tubular portion 521 with no contact therebetween. The upper nozzle 181 and the opposed member tubular portion 521 form a space therebetween, which will hereinafter be called a "nozzle gap 56".

The flange support 613 can have a substantially annular disc shape around the center axis J1. The flange support 613 is positioned below the opposed member flange portion 522. The flange support 613 has an inner diameter smaller than an outer diameter of the opposed member flange portion 522 of the top plate 5. The flange support 613 has an outer diameter larger than the outer diameter of the opposed member flange portion 522 of the top plate 5. The support connector 614 can have a substantially tubular shape around the center axis J1. The support connector 614 connects the flange support 613 and the retainer body 611 at a circumference of the opposed member flange portion 522. In the opposed member retainer 61, the retainer body 611 configures a retainer upper portion vertically facing an upper surface of the opposed member flange portion 522, and the flange support 613 configures a retainer lower portion vertically facing a lower surface of the opposed member flange portion 522.

In a state where the top plate 5 is positioned as in FIG. 1, the flange support 613 is in contact from below with and supports an outer circumference of the opposed member flange portion 522 of the top plate 5. In other words, the opposed member flange portion 522 is supported by the opposed member retainer 61 of the opposed member shift mechanism 6. The top plate 5 is accordingly positioned above the substrate 9 and the substrate retainer 31 and is hung from the opposed member retainer 61. The vertical position of the top plate 5 depicted in FIG. 1 will hereinafter be referred to as a "first position". The top plate 5 located at the first position is retained by the opposed member shift mechanism 6 and is positioned above and spaced apart from the substrate retainer 31.

The flange support 613 is provided with a shift restrictor 616 restricting displacement of the top plate 5 (i.e. shift and rotation of the top plate 5). The shift restrictor 616 exemplified in FIG. 1 is configured as a projection projecting upward from an upper surface of the flange support 613. The shift restrictor 616 is inserted to a hole provided in the opposed member flange portion 522 to restrict displacement of the top plate 5.

The opposed member lift mechanism 62 vertically shifts the top plate 5 along with the opposed member retainer 61. FIG. 2 is a sectional view depicting a state where the top plate 5 descends from the first position indicated in FIG. 1. The vertical position of the top plate 5 depicted in FIG. 2 will hereinafter be referred to as a "second position". Specifically, the opposed member lift mechanism 62 vertically shifts the top plate 5 between the first position and the second position, relatively to the substrate retainer 31. The second position is located below the first position. In other words, the top plate 5 located at the second position is vertically closer to the substrate retainer 31 than the first position.

The plurality of engagement portions 53 of the top plate 5 located at the second position engages with the plurality of engagement portions 313 of the substrate retainer 31, respectively. The plurality of engagement portions 53 is supported by the plurality of engagement portions 313 located therebelow. In other words, the plurality of engagement portions 313 is opposed member supports for the top plate 5. The engagement portions 313 are exemplarily configured as pins substantially parallel in the vertical direction, and have upper ends fit in upward recesses provided at lower ends of the engagement portions 53. The opposed member flange portion 522 of the top plate 5 is disposed above and spaced apart from the flange support 613 of the opposed member retainer 61. The top plate 5 located at the second position is thus retained by the substrate retainer 31 and is spaced apart from the opposed member shift mechanism 6 (i.e. is not in contact with the opposed member shift mechanism 6).

The opposed member side wall 512 of the top plate 5 retained by the substrate retainer 31 has a lower end positioned below the upper surface of the retentive base 311 of the substrate retainer 31 or vertically flush with the upper surface of the retentive base 311. When the substrate rotary mechanism 33 is driven, the top plate 5 located at the second position is rotated along with the substrate 9 and the substrate retainer 31. In this manner, in the state where the top plate 5 is located at the second position, the substrate rotary mechanism 33 functions as a rotary portion configured to rotate the substrate 9 and the top plate 5 about the center axis J1.

Figure 5:
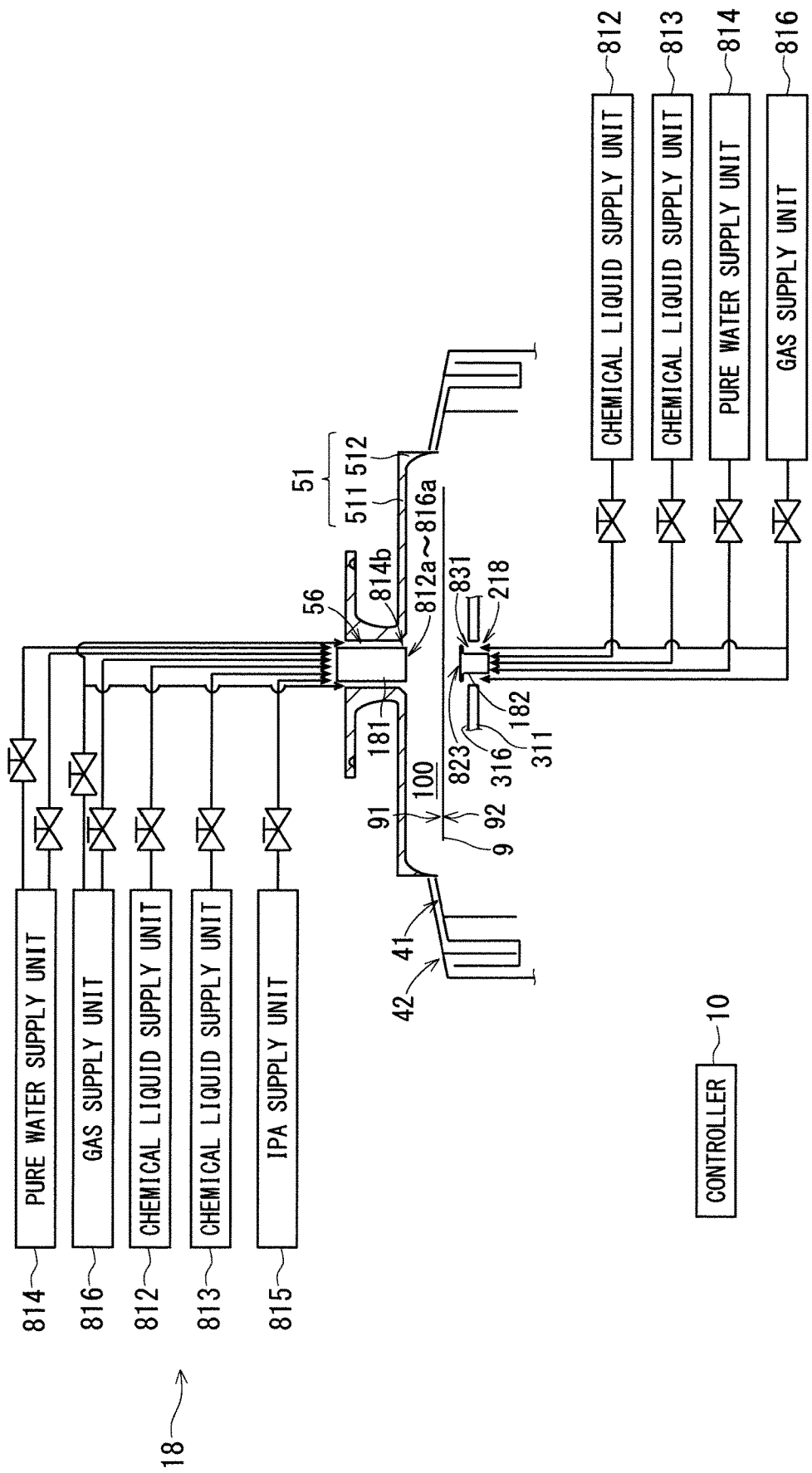
FIG. 5 is a schematic block diagram of a vaper-liquid supply unit 18.

FIG. 4 is a bottom view from below, of the upper nozzle 181. FIG. 5 is a schematic block diagram of a vaper-liquid supply unit 18 included in the substrate treatment apparatus 1. As depicted in FIGS. 4 and 5, the vaper-liquid supply unit 18 includes discharge ports 812a to 816a opened in a lower surface of the upper nozzle 181, and a discharge port 814b opened in a lower side surface of the upper nozzle 181.

The vaper-liquid supply unit 18 includes the upper nozzle 181 and the lower nozzle 182 described above. The vaper-liquid supply unit 18 further includes, as portions configured to supply vaper-liquid toward the upper nozzle 181, the nozzle gap 56, the lower nozzle 182, and the lower ring flow channel 218, chemical liquid supply units 812 and 813, a pure water supply unit 814, an IPA supply unit 815, and a gas supply unit 816. FIG. 5 depicts, out of the configurations of the vaper-liquid supply unit 18, two chemical liquid supply units 812, two chemical liquid supply units 813, two pure water supply units 814, two gas supply units 816, and the single IPA supply unit 815.

The chemical liquid supply units 812 and 813 are each connected to the upper nozzle 181 via a valve. Chemical liquid (e.g. diluted hydrofluoric acid (DHF)) fed from the chemical liquid supply unit 812 passes through a flow channel penetrating the upper nozzle 181, and is discharged from the discharge port 812a provided in the lower surface of the upper nozzle 181 toward the upper surface 91 of the substrate 9. Chemical liquid (e.g. SC1 solution including hydrogen peroxide water mixed with ammonia) fed from the chemical liquid supply unit 813 passes through a flow channel penetrating the upper nozzle 181, and is discharged from the discharge port 813a provided in the lower surface of the upper nozzle 181 toward the upper surface 91 of the substrate 9.

The pure water supply unit 814 is connected to the upper nozzle 181 via a valve. Pure water (deionized water (DIW)) fed from the pure water supply unit 814 to a first flow channel of the upper nozzle 181 passes through the flow channel penetrating the upper nozzle 181, and is discharged from the discharge port 814a provided in the lower surface of the upper nozzle 181 toward the upper surface 91 of the substrate 9. Pure water fed from the pure water supply unit 814 to a second flow channel of the upper nozzle 181 passes through the flow channel penetrating the upper nozzle 181, and is horizontally discharged from the discharge port 814b provided in the lower side surface of the upper nozzle 181.

Each of the chemical liquid supply units 812 and 813 and the pure water supply unit 814 is also connected to the lower nozzle 182 via a valve. Selectively opening and closing the respective valves achieves selective supply of chemical liquid and pure water from the chemical liquid supply units 812 and 813 and the pure water supply unit 814 toward the lower nozzle 182. Chemical liquid and pure water fed from the chemical liquid supply units 812 and 813 and the pure water supply unit 814 to the lower nozzle 182 each pass through a flow channel penetrating the lower nozzle 182, and is discharged from the lower surface center discharge port 823 provided in an upper surface of the lower nozzle 182 toward a lower surface 92 of the substrate 9.

The IPA supply unit 815 is connected to the upper nozzle 181 via a valve. Isopropyl alcohol (IPA) fed from the IPA supply unit 815 passes through a flow channel penetrating the upper nozzle 181, and is discharged from the discharge port 815a provided in the lower surface of the upper nozzle 181 toward the upper surface 91 of the substrate 9.

The gas supply unit 816 is connected to the upper nozzle 181 and the nozzle gap 56 via a valve. Inert gas (e.g. nitrogen gas) fed from the gas supply unit 816 passes through a flow channel penetrating in the upper nozzle 181 and the nozzle gap 56, and is discharged from the discharge port 816a provided in the lower surface of the upper nozzle 181 and the nozzle gap 56 toward the interior of the chamber.

The gas supply unit 816 is also connected to the lower ring flow channel 218 via a valve. Inert gas fed from the gas supply unit 816 to the lower ring flow channel 218 passes through a flow channel penetrating the lower ring flow channel 218, and is discharged from an annular discharge port 831 toward a center portion of an upper surface 316 of the retentive base 311.

The respective configurations of the vaper-liquid supply unit 18 are controlled by a controller 10. The remaining portions of the substrate treatment apparatus 1 (the substrate rotary mechanism 33, the guard shift mechanism 43, and the like) are also controlled by the controller 10.

Chemical liquid, pure water, and IPA will collectively be called treatment liquid where appropriate in the present application. Liquid (typically pure water) used for washing away particles and chemical liquid will occasionally be called rinse liquid. A portion configured to supply treatment liquid toward the upper surface 91 of the rotated substrate 9 through the opening 54 provided at the center of the top plate 5 in a planar view will occasionally be called a first supply unit, and a portion configured to supply pure water (rinse liquid) toward the lower surface 513 of the top plate 5 (the opposed member canopy 511) through the opening 54 of the top plate 5 will occasionally be called a second supply unit.

<1.2 Exemplary Treatment by Substrate Treatment Apparatus 1>

Figure 6:
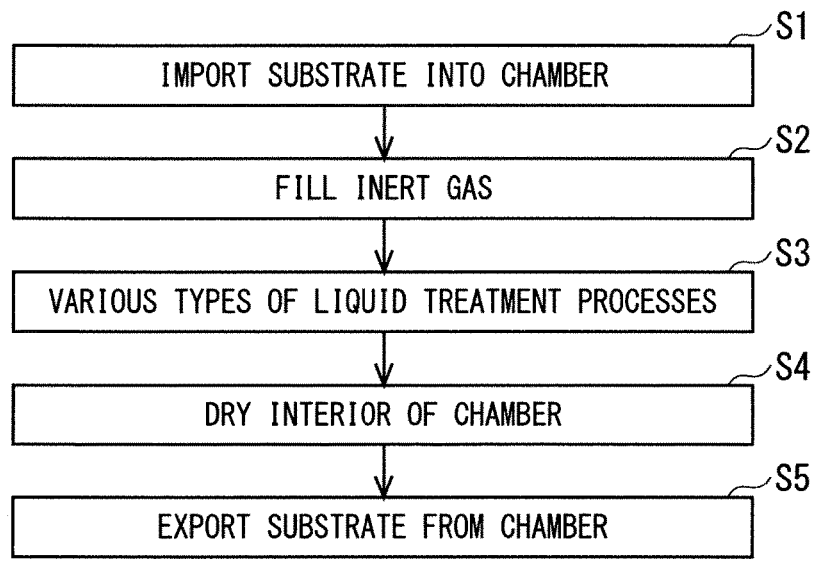
FIG. 6 is a flowchart depicting an exemplary flow of treating a substrate 9 by the substrate treatment apparatus 1.

FIG. 6 is a flowchart depicting an exemplary flow of treating the substrate 9 by the substrate treatment apparatus 1. The flow of treating the substrate by the substrate treatment apparatus 1 will be described with reference to FIGS. 1, 2, and 6.

In the state where the top plate 5 of the substrate treatment apparatus 1 is located at the first position (FIG. 1), the substrate 9 is mounted on the chucks 312 of the retentive base 311 by means of an external transport mechanism. The substrate 9 is thus supported by the chucks 312 located therebelow (step S1).

When the substrate 9 is imported, the opposed member lift mechanism 62 shifts the top plate 5 downward from the first position to the second position. The upper surface 311a of the retentive base 311, the lower surface 513 of the opposed member canopy 511, and an inner circumferential surface of the opposed member side wall 512 then form a semi-sealed space (hereinafter called a semi-sealed space 100). The opposed member side wall 512 thus serves as a closing portion closing a lateral portion of the space between the upper surface 91 of the substrate 9 and the lower surface 513 of the opposed member canopy 511.

The substrate rotary mechanism 33 subsequently starts rotating the substrate 9 (a rotating step). Furthermore, the gas supply unit 816 supplies inert gas (nitrogen gas herein) from the discharge port 816a and the nozzle gap 56 toward the upper surface 91 of the substrate 9. The gas supply unit 816 simultaneously supplies inert gas from the annular discharge port 831 toward the lower surface of the substrate 9 (a gas supplying step). The semi-sealed space 100 thus has an atmosphere filled with inert gas (i.e. an atmosphere with oxygen concentration and humidity decreased by the filled inert gas) (step S2) after a lapse of a predetermined time.

Figure 7:
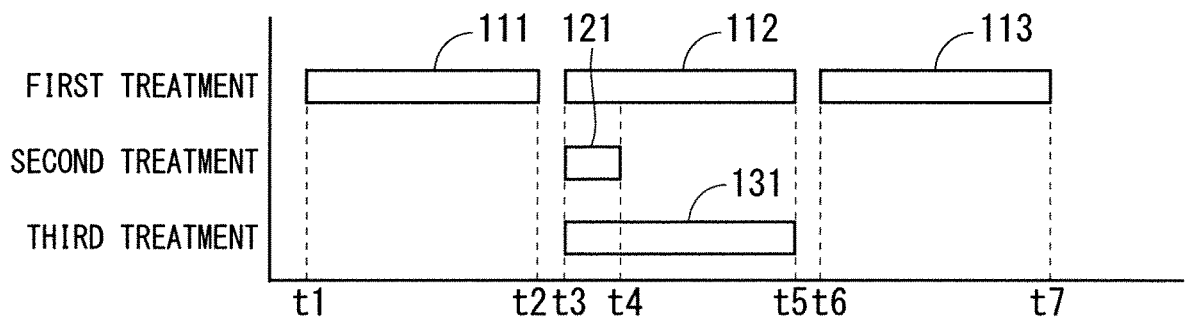
FIG. 7 is an exemplary timing chart in step S3.

When the atmosphere including filled inert gas is achieved, various types of liquid treatment processes are executed (step S3). FIG. 7 is an exemplary timing chart in step S3.

Herein, first treatment relates to supplying treatment liquid toward the upper surface 91 of the rotated substrate 9, second treatment relates to supplying rinse liquid toward the lower surface 513 of the rotated top plate 5 (the opposed member canopy 511), and third treatment relates to supplying treatment liquid toward the lower surface 92 of the rotated substrate 9.

First treatment 111 is initially executed in a period from time t1 to time t2. During the first treatment 111, the first guard 41 is located to be high enough to receive treatment liquid scattering from the substrate 9. In the first treatment 111, the chemical liquid supply unit 812 continuously supplies chemical liquid (e.g. DHF) from the discharge port 812a provided in the lower surface of the upper nozzle 181 toward the upper surface 91 of the rotated substrate 9. Rotation of the substrate 9 causes the chemical liquid reached the upper surface 91 to expand toward an outer circumference of the substrate 9 and coat the entire upper surface 91. The first treatment 111 (chemical liquid treatment with use of DHF) thus proceeds on the entire upper surface 91. The period from time t1 to time t2 lasts 30 seconds or the like. The substrate 9 and the top plate 5 rotate at a speed of 800 rpm or the like during this period.

After the chemical liquid supply unit 812 stops supplying chemical liquid at time t2, the substrate 9 and the top plate 5 are controlled to rotate at a higher speed during a period from time t2 to time t3. The chemical liquid (e.g. DHF) fed to the upper surface 91 of the substrate 9 then scatters radially outward from an outer circumferential edge of the substrate 9. The chemical liquid scattering from the substrate 9 is received by the first guard 41 and is discarded through the outlet port 44. The period from time t2 to time t3 lasts three seconds or the like. The substrate 9 and the top plate 5 rotate at a speed of 1200 rpm or the like during this period.

First treatment 112 is subsequently executed during a period from time t3 to time t5. In the first treatment 112, the pure water supply unit 814 continuously supplies pure water (i.e. rinse liquid) from the discharge port 814a provided in the lower surface of the upper nozzle 181 toward the upper surface 91 of the rotated substrate 9. Rotation of the substrate 9 causes the pure water reached the upper surface 91 to expand toward the outer circumference of the substrate 9 and scatter radially outward from the outer circumferential edge of the substrate 9 along with chemical liquid (e.g. DHF) remaining on the upper surface 91. The chemical liquid and the pure water scattering from the substrate 9 are received at an inner wall of the first guard 41 and are discarded through the outlet port 44. The first guard 41 is thus substantially rinsed along with the upper surface 91 of the substrate 9. The period from time t3 to time t5 lasts 30 seconds or the like. The substrate 9 and the top plate 5 rotate at a speed of 1200 rpm or the like during this period.

Second treatment 121 is executed in a period from time t3 to time t4. In the second treatment 121, the pure water supply unit 814 continuously supplies pure water (i.e. rinse liquid) from the discharge port 814b provided in the side surface of the upper nozzle 181 toward the lower surface 513 and the tapered surface 154 of the rotated top plate 5 (the opposed member canopy 511). Rotation of the top plate 5 causes the pure water reached the lower surface 513 and the tapered surface 154 to expand toward the outer circumference of the top plate 5 and scatter radially outward from an outer circumferential edge of the top plate 5 along with chemical liquid (e.g. DHF adhered unintentionally in the first treatment 111) adhering to the lower surface 513 and the tapered surface 154. The chemical liquid and the pure water scattering from the top plate 5 are received by the first guard 41 and are discarded through the outlet port 44. The inner wall of the first guard 41 is thus substantially rinsed along with the lower surface 513 and the tapered surface 154 of the top plate 5. The period from time t3 to time t4 lasts four seconds or the like. The discharge port 814b discharges pure water at a flow rate of 500 (mL/min) or the like. FIG. 8 is a sectional view depicting the first treatment 112 and the second treatment 121 in the period from time t3 to time t4.

Third treatment 131 is executed in the period from time t3 to time t5. In the third treatment 131, the pure water supply unit 814 continuously supplies pure water (i.e. rinse liquid) from the lower surface center discharge port 823 provided in an upper surface of the lower nozzle 182 toward the lower surface 92 of the rotated substrate 9. Rotation of the substrate 9 causes the pure water reached the lower surface 92 to expand toward the outer circumference of the substrate 9 and scatter radially outward from the outer circumferential edge of the substrate 9. The chemical liquid and the pure water scattering from the substrate 9 are received at an inner wall of the first guard 41 and are discarded through the outlet port 44. The interior of the first guard 41 is thus substantially rinsed along with the lower surface 92 of the substrate 9.

During a period from time t5 to time t6 after the pure water supply unit 814 stops supplying pure water at time t5, the substrate 9 and the top plate 5 are controlled to rotate at a speed equal to the previous speed (e.g. 1200 rpm). Pure water fed to the lower surface 513 of the top plate 5 (the opposed member canopy 511), the upper surface 91 of the substrate 9, the lower surface 92 of the substrate 9, the upper surface 316 of the retentive base 311, and the like then scatters radially outward from the outer circumferential edge. The scattered pure water is received at the inner wall of the first guard 41 and is discarded through the outlet port 44. The period from time t5 to time t6 lasts three seconds or the like.

First treatment 113 is subsequently executed during a period from time t6 to time t7. In the first treatment 113, the first guard 41 descends and the second guard 42 gets ready to receive treatment liquid scattering from the rotated substrate 9 and the like. In the first treatment 113, the IPA supply unit 815 continuously supplies IPA from the discharge port 815a provided in the lower surface of the upper nozzle 181 toward the upper surface 91 of the rotated substrate 9. Rotation of the substrate 9 causes the IPA reached the upper surface 91 to expand toward the outer circumference of the substrate 9 and coat the entire upper surface 91. The first treatment 113 thus proceeds to replace pure water with IPA on the entire upper surface 91. The period from time t6 to time t7 lasts 30 seconds or the like. The substrate 9 and the top plate 5 rotate at a speed of 800 rpm or the like during this period.

During the period from time t6 to time t7, which comes after the period of the second treatment 121 (the period from time t3 to time t4), the upper surface 91 of the substrate 9 is coated with a film of treatment liquid (specifically, IPA liquid). The gas supplying step is continuously executed in the period, and the semi-sealed space 100 is provided with an atmosphere filled with inert gas (i.e. an atmosphere having oxygen concentration and humidity decreased by the filled inert gas). In this manner, the lower surface 513 of the top plate 5 (the opposed member canopy 511) is caused to be dried in the state where the upper surface 91 of the substrate 9 is provided with the film of treatment liquid. Even if foreign matter (e.g. a contamination source to the substrate such as particles) adhering to the lower surface 513 falls off in the drying process, the foreign matter is received at the liquid film on the upper surface 91 of the substrate 9 and is unlikely to adhere to the upper surface 91.

The IPA supply unit 815 stops supplying IPA at time t7, and drying treatment is executed (step S4) after various types of liquid treatment processes (step S3) end. In the rotating step for drying treatment, the substrate 9 and the top plate 5 are rotated faster than rotation in the first treatment 111 to first treatment 113 and the second treatment 121. The substrate 9 and the top plate 5 rotate at a speed of 2000 rpm or the like during this period. Various types of liquid adhering to the substrate 9 and the top plate 5 thus scatters radially outward from the outer circumferential edge, is received at an inner wall of the second guard 42, and is discarded through the outlet port 44.

When the drying treatment ends, the opposed member lift mechanism 62 shifts the top plate 5 upward to reach the state depicted in FIG. 1 and the external transport mechanism exports the substrate 9 from the substrate retainer 31 (step S5). The present preferred embodiment includes preliminarily executing the second treatment 121 and the drying treatment (step S4). The lower surface 513 of the top plate 5 (the opposed member canopy 511) is hardly provided with adhering matter during export (step S5) to prevent the adhering matter from falling onto the substrate 9 while the top plate 5 is ascending.

<1.3 Effects>

Described below are effects of the substrate treatment apparatus 1 and exemplary treatment according to the present preferred embodiment. Herein, assume that the first treatment 111 to the first treatment 113 are executed in a first supplying step, the second treatment 121 is executed in a second supplying step, and the third treatment 131 is executed in a third supplying step. Furthermore, assume that the first supplying step is executed in a first period, the second supplying step is executed in a second period, and the third supplying step is executed in a third period.

In the present preferred embodiment, the period from time t3 to time t4 corresponds to an overlapped period while the first period (from time t1 to time t2, from time t3 to time t5, and from time t6 to time t7) and the second period (from time t3 to time t4) are overlapped with each other. The aspect of the present preferred embodiment thus includes parallelly executing the first treatment 112 and the second treatment 121, to achieve improvement in throughput in comparison to a different aspect including the first period and the second period provided separately from each other. Furthermore, the period from time t3 to time t4 according to the present preferred embodiment corresponds to an overlapped period while the first period (from time t1 to time t2, from time t3 to time t5, and from time t6 to time t7) and the third period (from time t3 to time t4) are overlapped with each other. The aspect of the present preferred embodiment thus includes parallelly executing the first treatment 112 and the third treatment 131, to achieve improvement in throughput in comparison to a different aspect including the first period and the third period provided separately from each other.

During the overlapped period, even if foreign matter (e.g. a contamination source to the substrate such as particles) adhered to the lower surface 513 in the second treatment 121 falls off, the foreign matter is washed away by treatment liquid flowing on the upper surface 91 of the substrate 9 and is unlikely to adhere to the upper surface 91.

The first treatment 111 to the first treatment 113 include the first treatment 112 (rinsing treatment) of supplying rinse liquid toward the upper surface 91 of the rotated substrate 9, and the overlapped period corresponds to a period while the execution period of the rinsing treatment and the second period are overlapped with each other. Specifically, during the overlapped period, pure water (rinse liquid) is fed to both the upper surface 91 of the substrate 9 and the lower surface 513 of the top plate 5 (the opposed member canopy 511). Even if foreign matter (e.g. a contamination source to the substrate such as particles) or pure water adhered to the lower surface 513 in the second treatment 121 falls off to be mixed with treatment liquid (specifically pure water) on the substrate 9, the mixed matter less affects the substrate treatment in comparison to a case where the treatment liquid on the substrate 9 is chemical liquid.

The first treatment 112 and the second treatment 121 are overlapped with each other in a temporal manner, and the second treatment 121 ends while the first treatment 112 is being executed (specifically, at time t4). Even if foreign matter adhered to the lower surface 513 in the second treatment 121 falls off, the foreign matter is likely to be washed away by pure water flowing on the upper surface 91 of the substrate 9 during the first treatment 112 continuously executed after the overlapped period, and is unlikely to adhere particularly to the upper surface 91.

Particularly, the first treatment 112 and the second treatment 121, which are overlapped with each other in a temporal manner, start simultaneously at time t3. In comparison to an aspect of including the second treatment 121 starting after the first treatment 112, the aspect of the present preferred embodiment achieves a longer period of the first treatment 112 continuously executed after the overlapped period. Accordingly, even if foreign matter adhered to the lower surface 513 in the second treatment 121 falls off, the foreign matter is likely to be washed away by pure water flowing on the upper surface 91 of the substrate 9 during the longer first treatment 112 continuously executed after the overlapped period, and is unlikely to adhere particularly to the upper surface 91.

The second supply unit according to the present preferred embodiment has the discharge port 814b horizontally opened below the opening of the top plate 5, and supplies pure water from the discharge port 814b toward the lower surface 513 of the rotated top plate 5 (the opposed member canopy 511) (FIG. 8). With a second supply unit having a discharge port opened diagonally upward according to an exemplary aspect different from the present preferred embodiment, pure water discharged from the discharge port includes an upward component, so that the pure water may hit the tapered surface 154 of the top plate 5 and spatter to adhere to the vicinity of the upper nozzle 181, or may hit the lower surface 513 of the top plate 5 (the opposed member canopy 511) and spatter to adhere to the upper surface 91 of the substrate 9. With a second supply unit having a discharge port opened diagonally downward according to another exemplary aspect, pure water discharged from the discharge port includes a downward component, so that the pure water may not appropriately be fed toward the lower surface 513. In contrast, the second supply unit according to the present preferred embodiment has the discharge port 814b opened horizontally, so that pure water discharged horizontally from the discharge port 814b is likely to appropriately be fed toward the lower surface 513 to appropriately remove adhering matter to the lower surface 513.

In particular, the top plate 5 includes the tapered surface 154 extending diagonally upward from the inner circumference of the lower surface 513 toward the center, and the discharge port 814b of the second supply unit faces the tapered surface 154. Pure water discharged horizontally from the discharge port 814b initially reaches the tapered surface 154 and then proceeds diagonally downward along the tapered surface 154 to be guided to the lower surface 513. In comparison to the top plate 5 provided with no tapered surface 154 according to a different aspect, adhering matter on the lower surface 513 of the top plate 5 (the opposed member canopy 511) according to the present preferred embodiment is likely to be removed appropriately.

FIG. 9 is a chart of relations between treatment conditions and treatment results of the second treatment. In this chart, a flow rate of pure water indicates a flow rate of pure water discharged from the discharge port 814b. A rotational speed indicates a rotational speed of the substrate 9 and the top plate 5. A discharge period indicates a period while pure water is discharged from the discharge port 814b (i.e. the period from time t3 to time t4). TS-N2 indicates a flow rate of inert gas discharged from the nozzle gap 56. BB-N2 indicates a flow rate of inert gas discharged from the discharge port 816a. BS-N2 indicates a flow rate of inert gas discharged from the annular discharge port 831. OK in a result field indicates that treatment liquid preliminarily applied to a plurality of points (e.g. four points from a center portion to an outer circumferential portion) on the lower surface 513 of the top plate 5 (the opposed member canopy 511) is removed by the second treatment. NG in the result field indicates that treatment liquid applied to at least one of the points (e.g. a point in the outer circumferential portion) is not removed by the second treatment. Whether OK or NG is determined in accordance with change in color of pH paper made in contact with the plurality of points after the second treatment.

As indicated in FIG. 9, the second treatment by the substrate treatment apparatus 1 appropriately rinses the lower surface 513 with use of pure water having the flow rate of 300 (mL/min) and discharged for a period of at least three seconds. Alternatively, the second treatment appropriately rinses the lower surface 513 with use of pure water having the flow rate of 400 (mL/min) or 500 (mL/min) and discharged for a period of at least two seconds. The second treatment 121 according to the present preferred embodiment is executed at a flow rate of 500 (mL/min) for four seconds, and thus appropriately rinses the lower surface 513.

2. Modification Examples

The preferred embodiment of the present invention is described above. The present invention can be modified in various manners in addition to those described above, without departing from the purpose of the present invention.

The above preferred embodiment exemplifies the aspect including the three treatment processes of the first treatment 111 to the first treatment 113, the single second treatment 121, and the single third treatment 131. The present invention, however, is not limited to this case. The present invention can be embodied in a case where at least one first treatment process and at least one second treatment process are executed and there is provided an overlapped period therebetween. The present invention can include executing at least one third treatment process, or include no third treatment. In the case where a plurality of substrates is continuously treated one by one, such an overlapped period can be provided for treatment of each of the substrates, or can be provided for treatment of one of several substrates.

FIG. 10 is a timing chart of liquid treatment (step S3) according to a modification example. This liquid treatment includes executing first treatment 111A to first treatment 115A, to the upper surface 91 of the substrate 9. The first treatment 111A relates to supplying chemical liquid (e.g. DHF) toward the upper surface 91, similarly to the first treatment 111. The first treatment 112A relates to supplying pure water toward the upper surface 91, similarly to the first treatment 112. The first treatment 115A relates to supplying IPA toward the upper surface 91, similarly to the first treatment 113 described above. Exemplary treatment according to the modified example is different from the exemplary treatment according to the above preferred embodiment in that the first treatment 113A and the first treatment 114A are executed between the first treatment 112A and the first treatment 115A. The present modification example relates to a substrate treatment apparatus 1A (FIG. 11) having four guards 41A, 42A, 43A, and 44A configured to ascend and descend independently from each other.

In the first treatment 113A, the chemical liquid supply unit 813 continuously supplies chemical liquid (e.g. SC1 solution) from the discharge port 813a provided in the lower surface of the upper nozzle 181 toward the upper surface 91 of the rotated substrate 9. Rotation of the substrate 9 causes the chemical liquid reached the upper surface 91 to expand toward an outer circumference of the substrate 9 and coat the entire upper surface 91. The first treatment 111A (chemical liquid treatment with use of the SC1 solution) thus proceeds on the entire upper surface 91. A period from time t16 to time t17 lasts 30 seconds or the like. The substrate 9 and the top plate 5 rotate at a speed of 800 rpm or the like during this period. Chemical liquid scattering from the substrate 9 is received at an inner wall of the second guard 42A and is discarded through the outlet port 44.

The first treatment 114A is subsequently executed during a period from time t18 to time t20. In the first treatment 114A, as in the first treatment 112, the pure water supply unit 814 continuously supplies pure water (i.e. rinse liquid) from the discharge port 814a provided in the lower surface of the upper nozzle 181 toward the upper surface 91 of the rotated substrate 9. Rotation of the substrate 9 causes the pure water reached the upper surface 91 to expand toward the outer circumference of the substrate 9 and scatter radially outward from the outer circumferential edge of the substrate 9 along with chemical liquid (e.g. SC1 solution) remaining on the upper surface 91. The chemical liquid and the pure water scattering from the substrate 9 are received at an inner wall of the first guard 41A and are discarded through the outlet port 44. The inner wall of the first guard 41A is substantially rinsed along with the upper surface 91 of the substrate 9. The period from time t18 to time t20 lasts 30 seconds or the like. The substrate 9 and the top plate 5 rotate at a speed of 1200 rpm or the like during this period.

This modification example includes executing the second treatment 121A similar to the second treatment 121, during a period from time t13 to time 14, and executing the second treatment 122A similar to the second treatment 121, during a period from time t18 to time t19. That is, this modification example includes the first period and the second period overlapped with each other in each of the periods (overlapped periods) from time t13 to time t14 and from time t18 to time t19, to achieve rinsing the lower surface 513 of the top plate 5 (the opposed member canopy 511) with no adverse effect on throughput.

In a case where the first supplying step includes a plurality of rinsing treatment processes of supplying rinse liquid to the upper surface 91 of the substrate 9 as in the present modification example, an execution period of at least one of the plurality of rinsing treatment processes and the second period have only to be overlapped with each other. Particularly in an aspect in which an execution period of the last rinsing treatment (the period from time t18 to time t20 exemplified in FIG. 10) and the second period are overlapped with each other, foreign matter is less likely to adhere to the lower surface 513 of the top plate 5 (the opposed member canopy 511) at the end of liquid treatment to the substrate 9. This inhibits foreign matter from falling from the lower surface 513 of the top plate 5 (the opposed member canopy 511) onto the upper surface 91 of the substrate 9 upon export of the substrate 9 or upon import of a subsequent substrate 9.

The above preferred embodiment exemplifies the aspect in which the first treatment 112 of supplying pure water toward the upper surface 91 of the substrate 9 and the second treatment 121 of supplying pure water toward the lower surface 513 of the top plate 5 are overlapped with each other in a temporal manner. The present invention, however, is not limited to this case. The present invention is applicable to an exemplary aspect in which the first treatment 111 or 113 of supplying chemical liquid toward the upper surface 91 of the substrate 9 and the second treatment 121 of supplying pure water toward the lower surface 513 of the top plate 5 are overlapped with each other in a temporal manner.

The above preferred embodiment exemplifies the aspect in which the first treatment 112 and the second treatment 121 overlapped with each other in a temporal manner start simultaneously at time t3. The present invention, however, is not limited to this case. For example, the first treatment 112 can start before the second treatment 121 starts, or the second treatment 121 can start before the first treatment 112 starts. In the case where the first treatment 112 starts before the second treatment 121 starts, the second treatment 121 is executed while the upper surface 91 of the substrate 9 is coated with treatment liquid by the first treatment 112 started earlier, so that foreign matter or the like falling from the lower surface 513 by the second treatment 121 is less likely to adhere directly to the upper surface 91 of the substrate 9.

The above preferred embodiment exemplifies the aspect in which pure water is adopted as rinse liquid. Liquid other than pure water (e.g. carbonated water) can alternatively be adopted as rinse liquid.

The substrate treatment apparatus 1 is applicable to treatment of a semiconductor substrate, as well as a glass substrate included in a display device such as a liquid crystal display device, a plasma display, or a field emission display (FED). The substrate treatment apparatus 1 is also applicable to treatment of an optical disk substrate, a magnetic disk substrate, a magnetooptical disk substrate, a photomask substrate, a ceramic substrate, a solar cell substrate, and the like.

The substrate treatment apparatus 1 can optionally be provided with an additional supply unit configured to supply treatment liquid other than chemical liquid, pure water, and IPA mentioned above. The gas supply unit 816 can alternatively supply gas other than nitrogen gas.

The substrate treatment methods and the substrate treatment apparatuses according to the preferred embodiments and the modification examples thereof are described above as exemplary preferred embodiments of the present invention and will not limit the scope of the present invention. The present invention can include appropriate combination of the preferred embodiments, modification of any appropriate constituent element according to each of the preferred embodiments, or exclusion of any appropriate constituent element according to each of the preferred embodiments, which should be made within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment apparatus configured to treat a substrate, the apparatus comprising:
    a substrate retainer horizontally retaining the substrate;
    a blocking portion including a lower surface facing an upper surface of said substrate and a tapered surface extending diagonally upward from an inner periphery of the lower surface toward a center of the lower surface;
    a rotary portion configured to rotate said substrate and said blocking portion about a rotary axis passing a center of said substrate and extending vertically;
    a first supply unit configured to supply treatment liquid toward said upper surface of said rotated substrate through an opening provided at a center of said blocking portion in a planar view; and
    a second supply unit configured to supply rinse liquid horizontally toward said tapered surface and said lower surface from the center of said rotated blocking portion through said opening of said blocking portion,
    wherein said first supply unit supplies said treatment liquid during a first period and said second supply unit supplies said rinse liquid during a second period, and the first period and the second period are overlapped with each other during an overlapped period.

2. The substrate treatment apparatus according to claim 1, wherein said blocking portion is provided with a closing portion closing a space between said upper surface of said substrate and said lower surface of said blocking portion from other spaces.

3. The substrate treatment apparatus according to claim 1, further comprising a gas supply unit configured to supply inert gas to a space between said upper surface of said substrate and said lower surface of said blocking portion through said opening of said blocking portion.

4. The substrate treatment apparatus according to claim 1, wherein said second supply unit includes a discharge port opened horizontally below said opening and facing said tapered surface.

* * * * *